United States Patent
Zhou et al.

(10) Patent No.: US 8,097,082 B2
(45) Date of Patent: Jan. 17, 2012

(54) NONPLANAR FACEPLATE FOR A PLASMA PROCESSING CHAMBER

(75) Inventors: Jianhua Zhou, San Jose, CA (US); Deenesh Padhi, Sunnyvale, CA (US); Karthik Janakiraman, San Jose, CA (US); Hang Yu, Santa Clara, CA (US); Siu F. Cheng, San Jose, CA (US); Yoganand Saripalli, Santa Clara, CA (US); Tersem Summan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 933 days.

(21) Appl. No.: 12/110,879

(22) Filed: Apr. 28, 2008

(65) Prior Publication Data
US 2009/0269512 A1  Oct. 29, 2009

(51) Int. Cl.
*C23C 16/50* (2006.01)
(52) U.S. Cl. ........ 117/200; 118/723 I; 427/569; 427/575
(58) Field of Classification Search .................. 427/569, 427/575; 118/723 I; 117/200
See application file for complete search history.

(56) References Cited

U.S. PATENT DOCUMENTS

| | | |
|---|---|---|
| 3,830,194 A | 8/1974 | Benzing et al. |
| 4,455,467 A | 6/1984 | Dills |
| 4,522,149 A | 6/1985 | Garbis et al. |
| 4,809,421 A | 3/1989 | Justice |
| 4,927,991 A | 5/1990 | Wendt et al. |
| 5,000,113 A | 3/1991 | Wang et al. |
| 5,044,943 A | 9/1991 | Bowman et al. |
| 5,173,580 A | 12/1992 | Levin et al. |
| 5,332,443 A | 7/1994 | Chew et al. |
| 5,421,893 A | 6/1995 | Perlov |
| 5,439,524 A | 8/1995 | Cain et al. |
| 5,582,866 A | 12/1996 | White et al. |
| 5,611,865 A | 3/1997 | White et al. |
| 5,614,055 A * | 3/1997 | Fairbairn et al. ......... 156/345.33 |
| 5,628,869 A | 5/1997 | Mallon |
| 5,819,434 A | 10/1998 | Herchen et al. |
| 5,820,686 A | 10/1998 | Moore |

(Continued)

FOREIGN PATENT DOCUMENTS

KR   10-2007-0089533   8/2007

(Continued)

OTHER PUBLICATIONS

International Search Report and Written Opinion dated Nov. 24, 2009 for International Application No. PCT/US2009/039674. (APPM/012999 PCT).

*Primary Examiner* — Michael Kornakov
*Assistant Examiner* — Kenneth A Bratland, Jr.
(74) *Attorney, Agent, or Firm* — Patterson & Sheridan, L.L.P.

(57) ABSTRACT

A method and apparatus for adjust local plasma density during a plasma process. One embodiment provides an electrode assembly comprising a conductive faceplate having a nonplanar surface. The nonplanar surface is configured to face a substrate during processing and the conductive faceplate is disposed so that the nonplanar surface is opposing a substrate support having an electrode. The conductive faceplate and the substrate support form a plasma volume. The nonplanar surface is configured to adjust electric field between the conductive plate and the electrode by varying a distance between the conductive plate and the electrode.

16 Claims, 5 Drawing Sheets

U.S. PATENT DOCUMENTS

| | | | |
|---|---|---|---|
| 5,844,205 A | 12/1998 | White et al. | |
| 5,876,838 A | 3/1999 | Mallon | |
| 5,990,016 A * | 11/1999 | Kim et al. | 438/707 |
| 6,113,700 A | 9/2000 | Choi | |
| 6,149,365 A | 11/2000 | White et al. | |
| 6,182,603 B1 | 2/2001 | Shang et al. | |
| 6,203,622 B1 | 3/2001 | Halpin et al. | |
| 6,228,438 B1 | 5/2001 | Schmitt | |
| 6,281,469 B1 | 8/2001 | Perrin et al. | |
| 6,344,420 B1 | 2/2002 | Miyajima et al. | |
| 6,371,712 B1 | 4/2002 | White et al. | |
| 6,383,573 B1 | 5/2002 | Beck et al. | |
| 6,447,980 B1 | 9/2002 | Rahman et al. | |
| 6,454,855 B1 | 9/2002 | Von Kanel et al. | |
| 6,502,530 B1 | 1/2003 | Turlot et al. | |
| 6,556,536 B1 | 4/2003 | Reynolds et al. | |
| 6,559,928 B1 | 5/2003 | Aoki | |
| 6,619,131 B2 | 9/2003 | Walchli et al. | |
| 6,631,692 B1 | 10/2003 | Matsuki et al. | |
| 6,740,367 B2 * | 5/2004 | Matsuki et al. | 427/585 |
| 6,793,733 B2 * | 9/2004 | Janakiraman et al. | 118/715 |
| 6,814,838 B2 | 11/2004 | Weichart | |
| 6,852,168 B2 | 2/2005 | Park | |
| 6,873,764 B2 | 3/2005 | Maisenholder et al. | |
| 6,916,407 B2 | 7/2005 | Voser et al. | |
| 6,918,352 B2 | 7/2005 | Von Kanel et al. | |
| 6,961,490 B2 | 11/2005 | Maisenhoelder et al. | |
| 2001/0023742 A1 | 9/2001 | Schmitt | |
| 2002/0011215 A1 | 1/2002 | Tei et al. | |
| 2003/0089314 A1 | 5/2003 | Matsuki et al. | |
| 2003/0176011 A1 | 9/2003 | Niira et al. | |
| 2004/0129211 A1 | 7/2004 | Blonigan et al. | |
| 2004/0250955 A1 | 12/2004 | Blonigan et al. | |
| 2005/0066898 A1 | 3/2005 | Schmitt et al. | |
| 2005/0233155 A1 | 10/2005 | Won et al. | |
| 2006/0005771 A1 | 1/2006 | White et al. | |
| 2006/0060138 A1 | 3/2006 | Keller et al. | |
| 2006/0228496 A1 * | 10/2006 | Choi et al. | 427/569 |

FOREIGN PATENT DOCUMENTS

KR   10-200700089533 A   *   8/2007

* cited by examiner

NONPLANAR FACEPLATE FOR A PLASMA PROCESSING CHAMBER

BACKGROUND OF THE INVENTION

1. Field of the Invention

Embodiments of the present invention generally relate to a plasma processing chamber configured to process semiconductor substrates. Particularly, embodiments of the present invention relate to a plasma chamber having an electrode with a nonplanar top surface.

2. Description of the Related Art

When processing substrates in a plasma environment, the uniformity of the plasma intensity will affect the uniformity of processing. For example, during a plasma enhanced chemical vapor deposition (PECVD) process to depositing advanced patterning film (APF), such as amorphous carbon, the within-substrate thickness is mainly determined by the plasma intensity uniformity. More material is deposited on the substrate where the plasma intensity is high and less material is deposited on the substrate where the plasma intensity is low. Similarly, in an etching process, more material is likely to be removed or etched from the substrate corresponding to a high plasma intensity area.

Therefore, non-uniformity in plasma processes can significantly decrease device performance and lead to waste because the deposited layer or etched portion is not consistent across the substrate due to the non-uniformity in plasma intensity.

Excellent process uniformity has become increasingly important as semiconductor devices become continuously more complex. Uniformity is important in both the feature-scale (<1 micron) and the wafer-scale (300 mm). Non-uniformities arise from a variety of reasons, for example variation of concentration of different ingredients of a processing gas, such as etching and passivating species, ion bombardment flux and energy, and temperature within the feature profile and across the wafer.

One of the non-uniformities observed is the edge effect in a PECVD chamber. The edge effect refers to a stronger plasma in an area which is about 15 millimeter away from the edge of the substrate. The edge effect may be observed at a hump region near the edge of the substrate after an APF deposition.

Figure 1A:
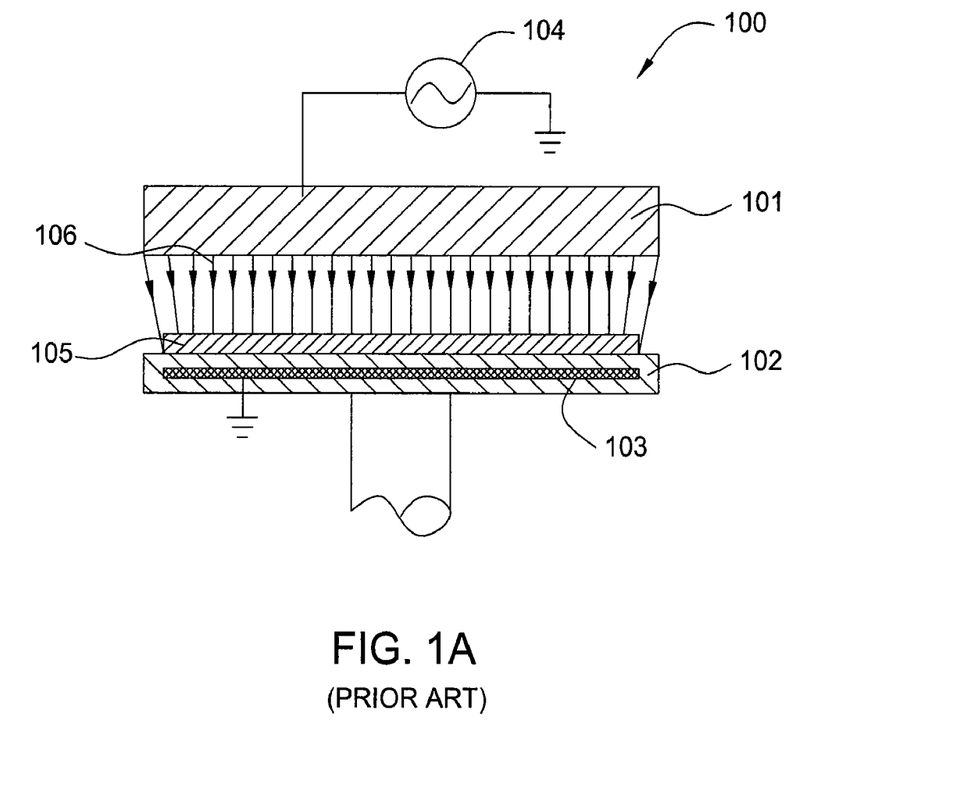
FIG. 1A schematically illustrates a conventional plasma reactor susceptible to an edge effect.

FIG. 1A schematically illustrates a conventional plasma reactor 100 susceptible to an edge effect. The plasma reactor 100 comprises an upper electrode 101 disposed over a substrate support 102. The substrate support 102 is configured to support a substrate 105 thereon so that the substrate 105 faces the upper electrode 101 during processing. The upper electrode 101 may be a showerhead configured to evenly distributing a processing gas to a process volume between the substrate support 102 and the upper electrode 101. A lower electrode 103 is disposed below the substrate 105, usually embedded in the substrate support 102. A RF power source 104 may be applied between the upper electrode 101 and the lower electrode 103 to generate a capacitive induced plasma between the upper electrode 101 and the substrate support 102.

The plasma intensity in the plasma reactor 100 generally relates to the concentration of the processing gas and density of an electric field 106 between the upper electrode 101 and the lower electrode 103. The size difference between the upper electrode 101 and the lower electrode 103 and sharp corners may cause an increase the electric field 106 near an edge region, thus, increased plasma intensity near the edge.

Figure 1B:
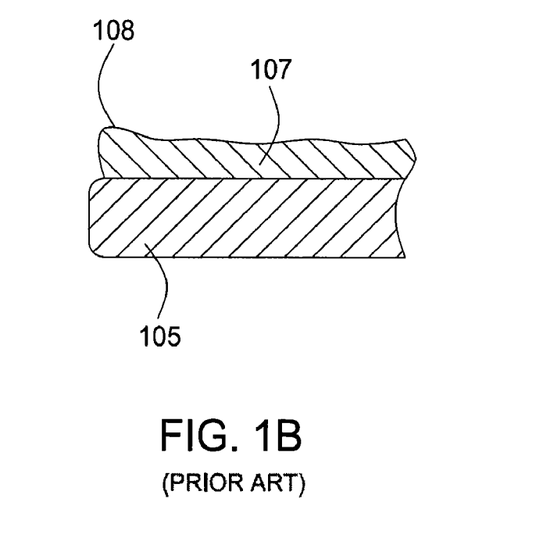
FIG. 1B is a schematic partial sectional view of a substrate with a film deposited under the edge effect.

FIG. 1B schematically illustrates a partial sectional view of the substrate 105 with a film 107 deposited thereon. As a result from the edge effect, a hump 108 is observed near the edge of the substrate 105.

Other non-uniformities also exist during plasma processing due to chamber structure and/or operating parameters.

Therefore, there is a need for apparatus and method for processing a semiconductor substrate with increased uniformity.

SUMMARY OF THE INVENTION

Embodiments of the present invention generally relate to apparatus and method for adjusting plasma intensity within a plasma reactor. Particularly, embodiments of the present invention relate to a plasma chamber having an electrode with a nonplanar top surface configured to adjust plasma intensity.

One embodiment of the present invention provides an electrode assembly for processing a substrate. The electrode assembly comprises a conductive faceplate having a nonplanar surface configured to face the substrate during processing, wherein the conductive faceplate is disposed so that the nonplanar surface is opposing a substrate support having an electrode, the conductive faceplate and the substrate support form a plasma volume, a RF power source is applied between the conductive faceplate and the electrode, and the nonplanar surface is configured to adjust electric field between the conductive plate and the electrode by varying a distance between the conductive plate and the electrode.

Another embodiment of the present invention provides an apparatus for processing a substrate. The apparatus comprises a chamber body having sidewalls, a substrate support disposed in the chamber body and configured to support the substrate, wherein the substrate support comprises an electrode, a lid assembly disposed on the sidewalls of the chamber body, wherein the lid assembly and the substrate support define a plasma volume, and the lid assembly comprises a conductive faceplate having a nonplanar surface facing the substrate support, and the nonplanar surface is configured to adjust electric field between the conductive plate and the electrode by varying a distance between the conductive plate and the electrode, and a RF power source coupled to one of the conductive faceplate or the electrode and configured to generate a plasma within the plasma volume.

Yet another embodiment of the present invention provides a method for processing a substrate. The method comprises positioning the substrate on a substrate support disposed in a processing chamber, wherein the substrate support has an electrode, supplying a processing gas to the processing chamber, and generating a plasma of the processing gas by applying a RF power between the electrode of the substrate support and a conductive faceplate disposed above the substrate, wherein the conductive faceplate has a nonplanar surface configured to adjust local plasma density.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to apparatus and method for adjusting plasma intensity within a plasma reactor. Particularly, embodiments of the present invention relate to a plasma chamber having an electrode with a nonplanar top surface configured to adjust plasma intensity.

In one embodiment, the nonplanar top surface of the electrode is configured to adjust electric field between the electrode and a second electrode by varying a distance between the electrodes. In one embodiment, a recess is formed on a faceplate corresponding to an edge area of a substrate to reduce plasma intensity near the edge area.

Figure 2:
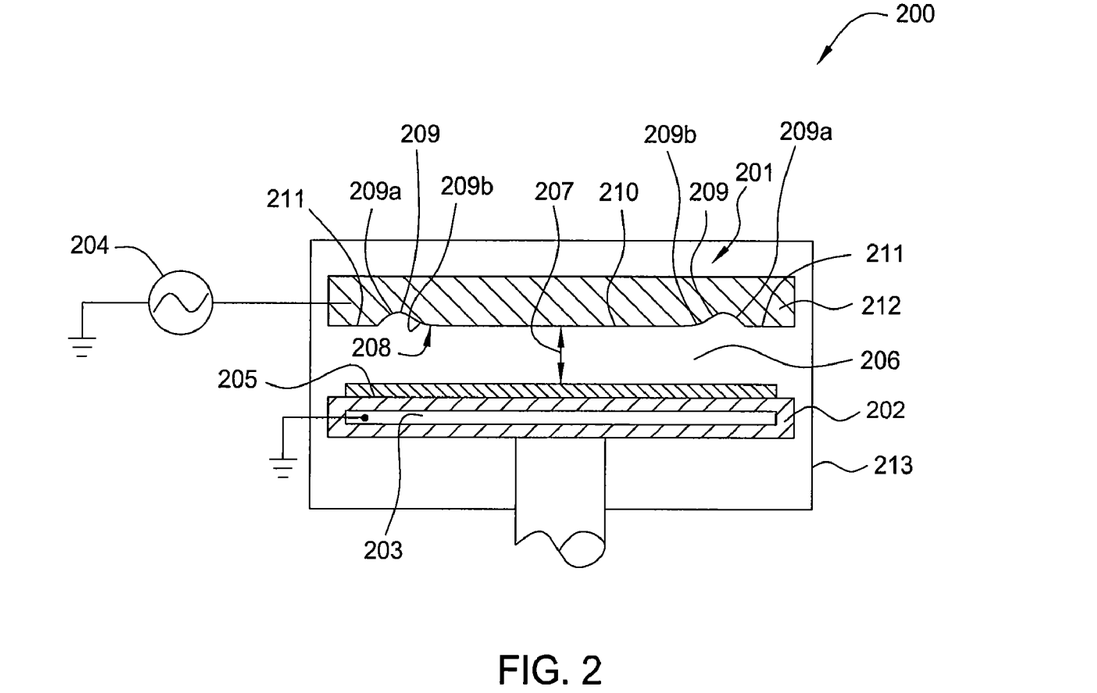
FIG. 2 is a schematic sectional side view of a plasma reactor in accordance with one embodiment of the present invention.

FIG. 2 is a schematic sectional side view of a plasma reactor 200 in accordance with one embodiment of the present invention. The plasma reactor 200 comprises an electrode assembly 201 disposed over a substrate support 202. The substrate support 202 and the electrode assembly 201 are generally disposed in a vacuum chamber 213. The substrate support 202 and the electrode assembly 201 are substantially parallel and define a plasma volume 206 therebetween.

The substrate support 202 is configured to support a substrate 205 thereon and to position the substrate 205 within the plasma volume 206. A second electrode 203 is disposed below the plasma volume 206 and configured to apply an electric field within the plasma volume 206 by reacting with the electrode assembly 201. In one embodiment, the second electrode 203 is embedded in the substrate support 202.

The plasma reactor 200 further comprises a RF power source 204 configured to generate a capacitively induced plasma within the plasma volume 206. In one embodiment, the RF power source 204 the electrode assembly 201 and the second electrode 203 is grounded. In another embodiment (not shown), the RF power source 204 may be applied to the second electrode 203 while the electrode assembly 201 is grounded.

The electrode assembly 201 may comprise a conductive faceplate 212 having a top surface 208 facing the plasma volume 206. In one embodiment, the top surface 208 is nonplanar so that a spacing 207 between the substrate 205 and the conductive faceplate 212 varies across the plasma volume 206. Variation in the spacing 207 is configured to adjust plasma intensity within the plasma volume 206.

In one embodiment, the top surface 208 may comprise one or more concaved portions configured to reduce local plasma intensity near the concaved portions. In another embodiment, the top surface 208 may comprise one or more convex portions configured to increase local plasma intensity near the convex portions. In another embodiment, the top surface 208 may comprise concaved and convex portions to achieve desired plasma intensity profile across the plasma volume 206.

In one embodiment, the top surface 208 of the conductive faceplate 212 may be nonplanar with concave, convex and/or planar portions smoothly joint together.

In one embodiment, the top surface 208 may comprise an inner planar portion 210 corresponding to a central portion of the plasma volume 206, a recess 209 formed outwardly from the inner planar portion 210, and an outer planar portion 211 formed outwardly from the recess 209. In one embodiment, the recess 209 may be formed in areas corresponding to an edge area of the substrate 205 to reduce the edge effect. The inner planar portion 210, the recess 209, and the outer planar portion 211 may be connected through rounded corners to avoid generation of sparks.

In one embodiment, the recess 209 may be formed by an outer slope 209a and an inner slope 209b. The outer slope 209a is initiated from the outer planar portion 211 and extending inward. The inner slope 209b is initiated from the inner planar portion 210 and extending outward. The inner slope 209b and the outer slope 209a are joined together smoothly.

The recess 209 may be circular, or rectangular depending on the shape of the substrate 206. In one embodiment, the plasma reactor 200 may be configured to process circular substrate having a radius of about 150 mm. The recess 209 may have depth of about 0.5 mm to about 2 mm. The recess 209 may be a circle having a radius of about 130 mm to about 140 mm. The inner slope 209b may be initiated from a circle concentric to the recess 209 and having radius of about 80 mm to about 100 mm. The outer slope 209a may be initiated from a circle concentric to the recess 209 and having a radius between about 140 mm to about 145 mm.

In one embodiment, the conductive faceplate 212 may have a plurality of gas distributing holes formed therein and configured to distribute a processing gas to the plasma volume 206.

Figure 3:
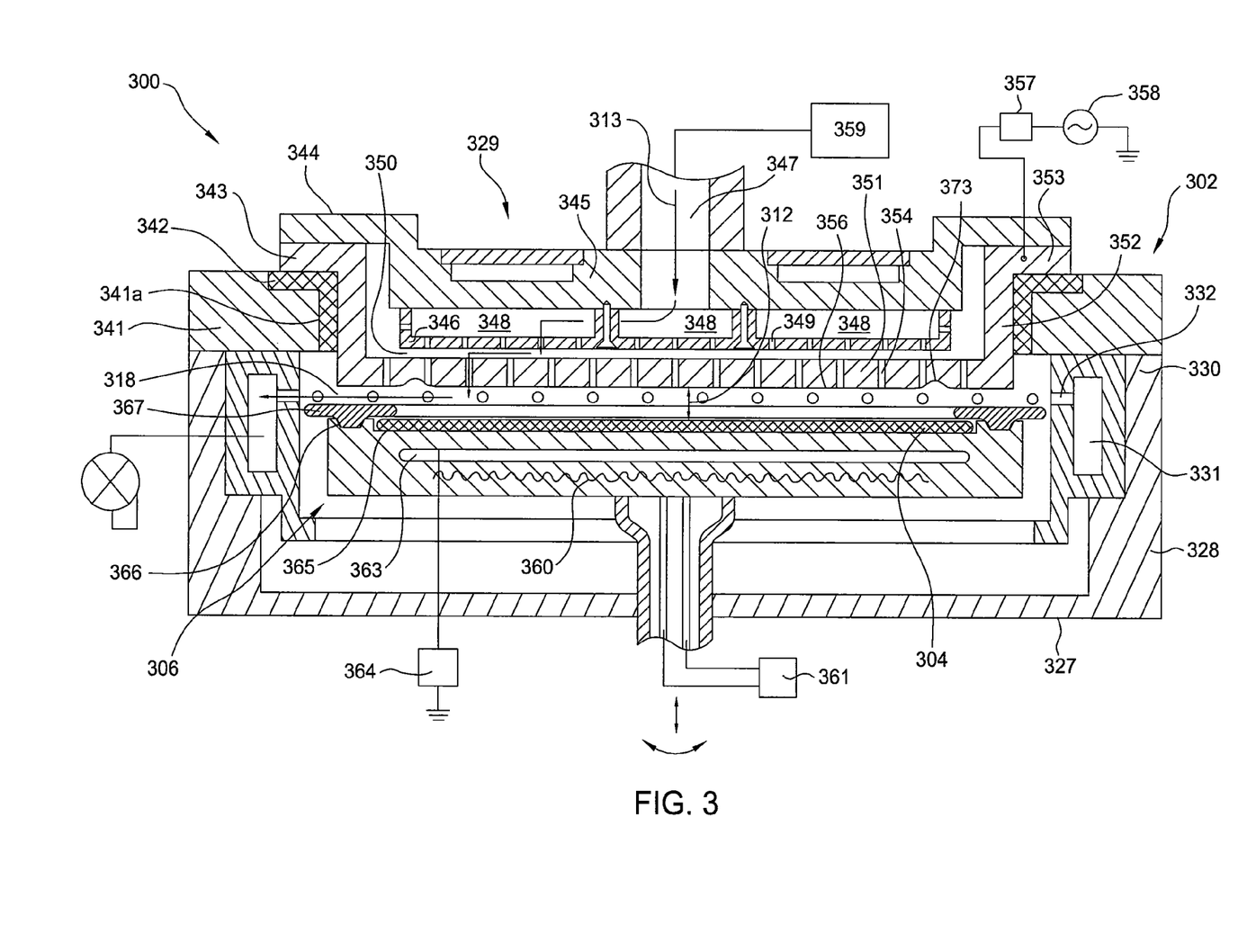
FIG. 3 is a schematic sectional side view of a plasma chamber in accordance with one embodiment of the present invention.

FIG. 3 is a schematic sectional side view of a plasma reactor 300 in accordance with one embodiment of the present invention. The plasma reactor 300 comprises a processing chamber 302 configured to process a substrate 304 therein.

The processing chamber 302 comprises chamber sidewalls 328, a chamber bottom 327, and a lid assembly 329. In one embodiment, the lid assembly 329 may be connected to the chamber sidewalls 328 by hedges. The chamber sidewalls 328, chamber bottom 327, and the lid assembly 329 define a processing volume 318.

A substrate support 306 is disposed in the processing volume 318 configured to support the substrate 304 during processing. The substrate support 306 may move vertically and rotate during processing. In one embodiment, the substrate support 306 may be a conventional electrostatic chuck that actively holds the substrate 304 during processing.

The substrate support 306 has a supporting surface 365 configured to support the substrate 304 thereon. In one embodiment, the substrate support 306 also has a recess 366 formed outwards the supporting surface 365 and configured to hold an edge ring 367. The edge ring 367 is configured to cover an edge region of the substrate 304 and to prevent any deposition on a bevel edge of the substrate 304.

In one embodiment, the substrate support 306 comprises an electrode 363 disposed below the supporting surface 365. The electrode 363 is substantially similar to the substrate 304 in size and shape. In one embodiment, the substrate 304 may be grounded through a matching circuit 364.

In one embodiment, the substrate support 306 may be temperature controlled by a temperature controller 361 adapted to cool and heat the substrate support 306 to a desired temperature. The temperature controller 361 may use conventional means, such as embedded resistive heating element 360, or fluid cooling channels that are coupled to a heat exchanger.

The lid assembly 329 generally comprises a lid body 341 sealingly disposed on the chamber sidewalls 328. The lid assembly 329 further comprises a faceplate 343 coupled to a gas distribution plate 344 sealingly coupled to one another. The faceplate 343 is disposed within an opening 341a of the lid body 341. In one embodiment, an isolator 342 may be disposed between the faceplate 343 and the lid body 341 to electronically isolate the faceplate 343 from the lid body 341 and the chamber sidewalls 328.

In one embodiment, the faceplate 343 comprises a front plate 351, sidewalls 352, and a flange 353. The flange 353 enables the faceplate 343 to sit in the opening 341a. When the lid assembly 329 is closed, the front plate 351 is positioned substantially parallel to the supporting surface 365 of the substrate support 306.

The faceplate 343 is generally formed from conductive materials and the front plate 351 is configured to be an electrode opposing the electrode 363. In one embodiment, the faceplate 343 may be connected to a RF power source 358 via a matching circuit 357. When RF power is applied to the faceplate 343, a plasma may be generated between the faceplate 343 and the substrate support 306 within the processing volume 318.

In one embodiment, the faceplate 341 may have a nonplanar top surface 356 so that a spacing 312 between the substrate 304 and the faceplate 343 varies across the substrate 304. Variation in the spacing 312 is configured to adjust plasma intensity within the processing volume 318.

In one embodiment, the top surface 356 may comprise one or more concaved portions configured to reduce local plasma intensity near the concaved portions. In another embodiment, the top surface 356 may comprise one or more convex portions configured to increase local plasma intensity near the convex portions. In another embodiment, the top surface 356 may comprise concaved and convex portions to achieve desired plasma intensity profile across the processing volume 318.

In one embodiment, the top surface 356 may be similar to the top surface 208 of the conductive faceplate 212 of FIG. 2. The top surface In one embodiment, the top surface 356 may comprise portions of concave regions, convex regions, planar portion regions, or the combinations thereof smoothly joint together.

Figure 4:
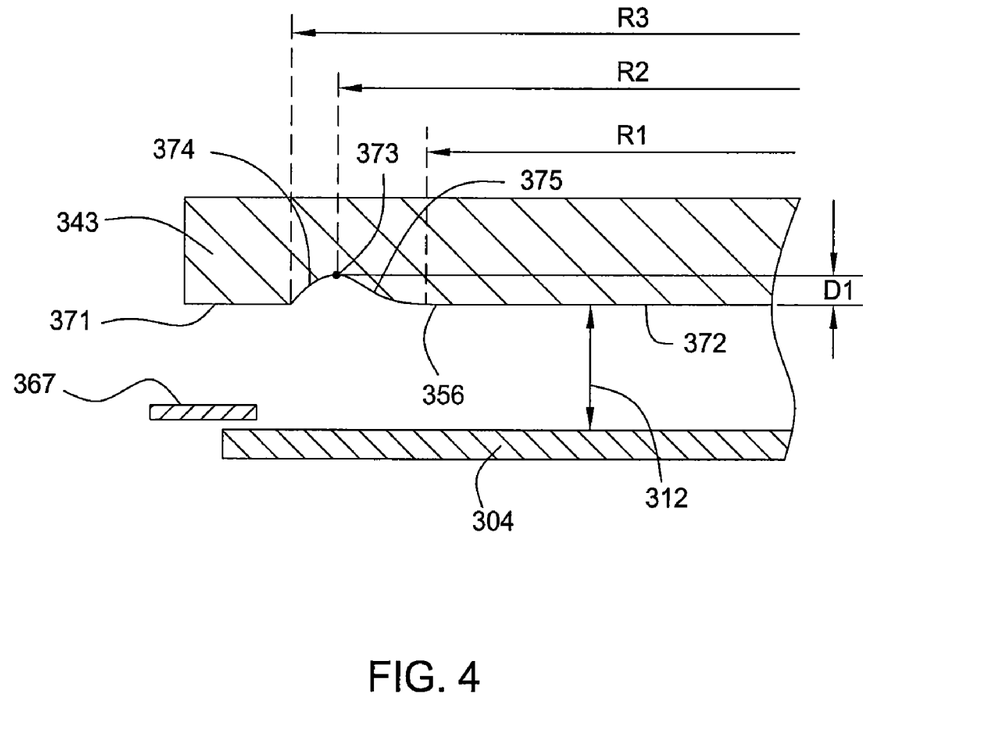
FIG. 4 is a schematic partial sectional side view of an electrode in accordance with one embodiment of the present invention.

FIG. 4 is a schematic partial sectional side view of the faceplate 343. In one embodiment, as shown in FIG. 4, the top surface 356 comprise an inner planar portion 372 corresponding to a central portion of the substrate 304, a recess 373 formed outwardly from the inner planar portion 372, and an outer planar portion 371 formed outwardly from the recess 373. In one embodiment, the recess 373 may be formed in areas corresponding to an edge area of the substrate 304 to reduce the edge effect. The inner planar portion 372, the recess 373, and the outer planar portion 371 may be connected through rounded corners to avoid generation of sparks.

In one embodiment, the recess 373 may be formed by an outer slope 374 and an inner slope 375. The outer slope 374 is initiated from the outer planar portion 371 and extending inward. The inner slope 375 is initiated from the inner planar portion 372 and extending outward. The inner slope 375 and the outer slope 374 are joined together smoothly.

In one embodiment, the plasma reactor 300 may be configured to process circular substrate having a radius of about 150 mm. The recess 373 may have depth D1 of about 0.5 mm to about 2 mm. The recess 373 may be a circle having a radius R2 of about 130 mm to about 140 mm. The inner slope 375 may be initiated from a circle concentric to the recess 373 and having radius R1 of about 80 mm to about 100 mm. The outer slope 374 may be initiated from a circle concentric to the recess 373 and having a radius R3 between about 140 mm to about 145 mm.

In one embodiment, the gas distribution plate 344 is coupled to a backside of the faceplate 343. The gas distribution plate 344, the sidewalls 352 and the front plate 351 of the faceplate 343 define a gas distributing volume 350. The gas distribution plate 344 may be sealingly coupled to the flange 353 of the faceplate 343. In one embodiment, the gas distribution plate 344 may be formed from conductive material. The RF power source 358 may be directly connected to the gas distribution plate 344, and RF power from the RF power source 358 may be applied to the faceplate 343 via the gas distribution plate 344.

In one embodiment, the gas distribution plate 344 and the faceplate 343 are configured to uniformly distribute a processing gas from a gas panel 359 to the processing volume 318. In one embodiment, the gas distribution plate 344 comprises a gas box 345 and a blocker plate 346. The gas box 345 is attached to the flange 353 of the faceplate 343. An inlet port 347 is formed through the gas box 345. The inlet port 347 is configured to receive one or more processing gas from the gas panel 359.

The blocker plate 346 is attached to the gas box 345 and facing the faceplate 343. The blocker plate 346 generally covers the inlet port 347 and allows the processing gas from the inlet port 347 to distribute across entire volume of the gas distributing volume 350. In one embodiment, the blocker plate 346 may enclose a narrow inner volume 348 between the blocker plate 346 and the gas box 345. The inlet port 347 opens to the narrow inner volume 348. The narrow inner volume 348 forces the processing gas to "diffuse" before travelling down to the processing volume 318. The blocker plate 346 has a plurality of through holes 349 formed therethrough to provide fluid communication between the narrow inner volume 348 and the gas distributing volume 350.

The faceplate 343 also has a plurality gas distributing holes 354 formed therethrough to provide fluid communication between the gas distributing volume 350 and the processing volume 318. Shape and/or distribution of the plurality of gas distribution holes 354 may be arranged to adjust concentration of processing gas.

A chamber liner 330 configured to provide an exiting path for the process gas may be disposed around the processing volume 318 inside the chamber sidewalls 328. The chamber liner 330 has a channel 331 formed therein. The channel 331 is generally connected to a vacuum device (not shown). A plurality of through holes 332 are formed through the chamber liner 330 to provide fluid communication between the processing volume 318 and the vacuum device via the channel 331 of the chamber liner 330. An arrow 313 schematically illustrates an approximate path of the processing gas during process.

Figure 5:
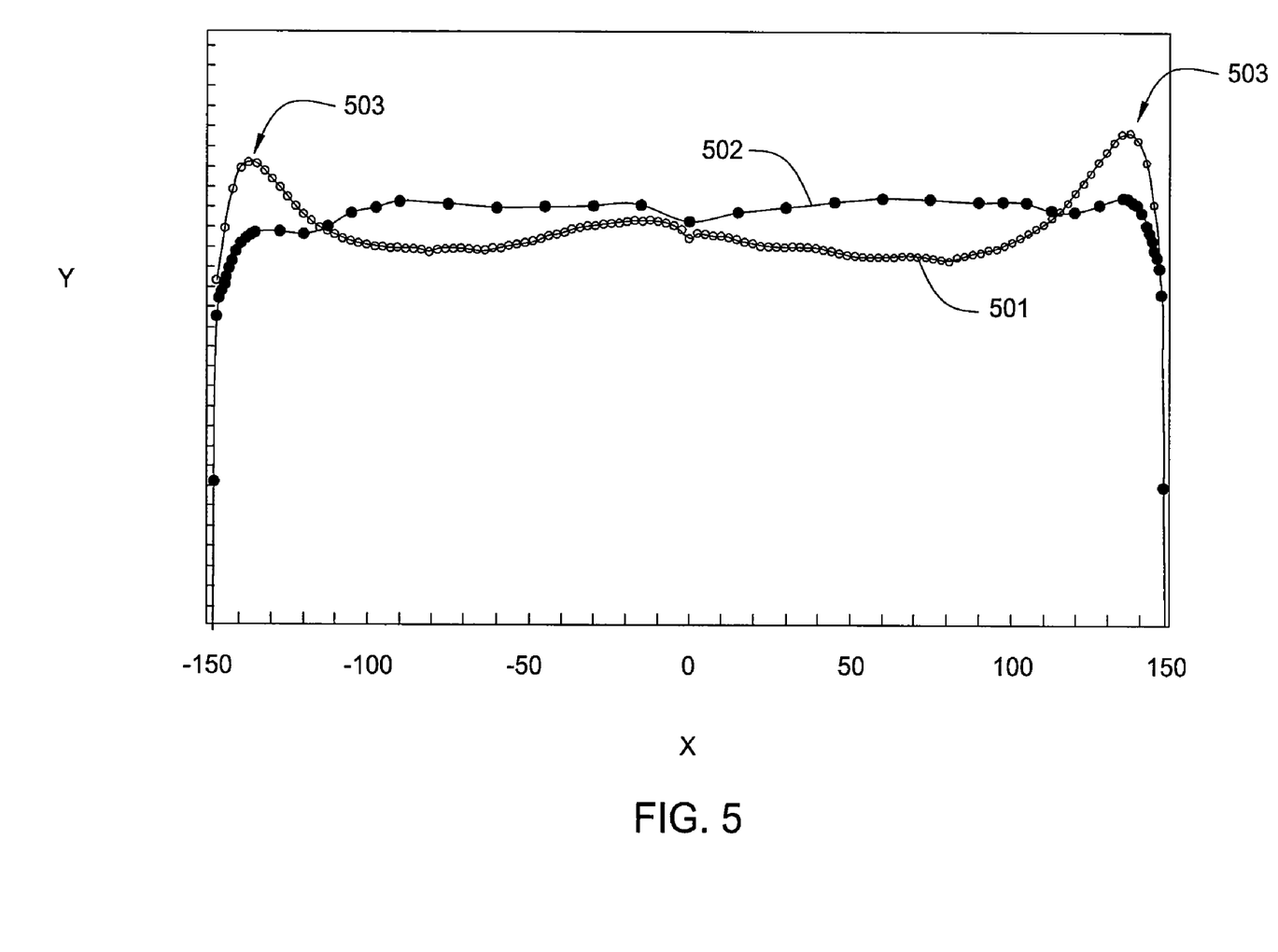
FIG. 5 is a schematic chart showing processing results in accordance with one embodiment of the present invention.

FIG. 5 is a schematic chart showing processing results in accordance with one embodiment of the present invention. The X axis of FIG. 5 indicates a distance from a center of a substrate in millimeter and the Y axis indicates normalized thickness of a film deposited on a substrate. Curve 501 schematically illustrates a thickness profile of an APF film deposited using a traditional PECVD chamber having a planar faceplate. As shown in curve 501, hump 503 was generated due to the edge effect. Curve 502 schematically illustrates a thickness profile of an APF film deposited with the same recipe as the film of curve 501, but using a PECVD chamber having a recess near the edge region in accordance with one embodiment of the present invention. Curve 502 does not have any hump near the edge region and has an increased the uniformity across the substrate.

Even though, improvement to a deposition process is described in the present application, embodiments of the present invention may be applied in any suitable process. For example, embodiments of the present invention may be applied to adjust plasma intensity for an etching process, or to adjust plasma intensity to achieve an intensity profile other than a uniform profile.

While the foregoing is directed to embodiments of the present invention, other and further embodiments of the invention may be devised without departing from the basic scope thereof, and the scope thereof is determined by the claims that follow.

What is claimed is:

1. An electrode assembly for processing a substrate, comprising:
   a conductive faceplate having a nonplanar surface configured to face the substrate during processing, wherein the conductive faceplate is disposed so that the nonplanar surface is opposing a substrate support having an electrode, the conductive faceplate and the substrate support form a plasma volume, a RF power source is applied between the conductive faceplate and the electrode, and the nonplanar surface is configured to reduce density of the electric field near an edge region of the substrate, the non planar surface of the conductive faceplate comprises:
   an inner planar portion corresponding to a center portion of the substrate;
   a recess outward to the planar portion and corresponding to the edge region of the substrate; and
   an outer planar portion outward to the recess, wherein the recess is smoothly connected to the inner planar portion and outer planar portion without corners, the recess is formed from an inner slope and an outer slope, the inner slope is outwardly initiated from the inner planar portion, the outer slope is inwardly initiated from the outer planar portion, the inner and outer slopes meet at a bottom of the recess, the recess having a maximum depth of about 0.5 mm to about 2 mm at a radius of about 130 mm to about 140 mm from a center of the conductive faceplate, the inner slope is initiated at a radius of about 80 mm to about 100 mm, and the outer slope is initiated at a radius of about 140 mm to about 145 mm.

2. The electrode assembly of claim 1, wherein the conductive faceplate has a plurality of gas distributing holes formed therethrough.

3. The electrode assembly of claim 1, further comprising a gas distribution plate coupled to the conductive faceplate on an opposite side of the nonplanar surface, wherein the gas distribution plate and the conductive faceplate are sealingly connected at an edge region, an inner volume is formed between the gas distribution plate and the conductive faceplate, and the conductive faceplate has a plurality of gas distributing holes in fluid communication with the inner volume.

4. The electrode assembly of claim 3, wherein the gas distribution plate comprises:

a gas box having an inlet port configured to receive a processing gas; and
a blocker plate attached to the gas box and facing the conductive faceplate, wherein the blocker plate has a plurality of through holes configured to provide fluid communication between the inlet port and the inner volume.

5. The electrode assembly of claim 1, wherein the nonplanar surface comprises a concaved portion configured to reduce density of a local electric field.

6. The electrode assembly of claim 1, wherein the nonplanar surface comprises a convex portion configured to increase density of a local electric field.

7. An apparatus for processing a substrate, comprising:
   a chamber body having sidewalls;
   a substrate support disposed in the chamber body and configured to support the substrate, wherein the substrate support comprises an electrode;
   a lid assembly disposed on the sidewalls of the chamber body, wherein the lid assembly and the substrate support define a plasma volume, and the lid assembly comprises a conductive faceplate having a nonplanar surface facing the substrate support; and
   a RF power source coupled to one of the conductive faceplate or the electrode and configured to generate a plasma within the plasma volume,
   wherein the nonplanar surface is configured to reduce density of the electric field near an edge region of the substrate, the non planar surface of the conductive faceplate comprises:
   an inner planar portion corresponding to a center portion of the substrate;
   a recess outward to the planar portion and corresponding to the edge region of the substrate; and
   an outer planar portion outward to the recess, wherein the recess is smoothly connected to the inner planar portion and outer planar portion without corners, the recess is formed from an inner slope and an outer slope, the inner slope is outwardly initiated from the inner planar portion, the outer slope is inwardly initiated from the outer planar portion, the first and second slopes meet at a bottom of the recess, the recess having a maximum depth of about 0.5 mm to about 2 mm at a radius of about 130 mm to about 140 mm from a center of the conductive faceplate, the inner slope is initiated at a radius of about 80 mm to about 100 mm, and the outer slope is initiated at a radius of about 140 mm to about 145 mm.

8. The apparatus of claim 7, wherein the recess is circular, and a ratio of a radius of recess and the radius of the substrate is between about 13:15 to about 14:15.

9. The apparatus of claim 7, wherein the conductive faceplate has a plurality of gas distributing holes formed therethrough and configured to distribute a processing gas to the plasma volume.

10. The apparatus of claim 9, wherein the lid assembly further comprises:
    a gas distribution plate coupled to the conductive faceplate on an opposite side of the nonplanar surface, wherein the gas distribution plate and the conductive faceplate are sealingly connected at an edge region, an inner volume is formed between the gas distribution plate and the conductive faceplate, and the inner volume is in fluid communication with the plasma volume through the plurality of gas distributing holes of the conductive face plate.

11. The apparatus of claim 10, wherein the gas distribution plate comprises:

a gas box having an inlet port configured to receive a processing gas; and a blocker plate attached to the gas box and facing the conductive faceplate, wherein the blocker plate has a plurality of through holes configured to provide fluid communication between the inlet port and the inner volume.

12. A method for processing a substrate, comprising:

positioning the substrate on a substrate support disposed in a processing chamber, wherein the substrate support has an electrode;

supplying a processing gas to the processing chamber; and generating a plasma of the processing gas by applying a RF power between the electrode of the substrate support and a conductive faceplate disposed above the substrate, wherein the conductive faceplate has a nonplanar surface configured to reduce density of the electric field near an edge region of the substrate, the non planar surface of the conductive faceplate comprises:

an inner planar portion corresponding to a center portion of the substrate;

a recess outward to the planar portion and corresponding to the edge region of the substrate; and an outer planar portion outward to the recess, wherein the recess is smoothly connected to the inner planar portion and outer planar portion without corners, the recess is formed from an inner slope and an outer slope, the inner slope is outwardly initiated from the inner planar portion, the outer slope is inwardly initiated from the outer planar portion, the inner and outer slopes meet at a bottom of the recess, the recess having a maximum depth of about 0.5 mm to about 2 mm at a radius of about 130 mm to about 140 mm from a center of the conductive faceplate, the inner slope is initiated at a radius of about 80 mm to about 100 mm, and the outer slope is initiated at a radius of about 140 mm to about 145 mm.

13. The method of claim 12, wherein the nonplanar surface comprises a recess corresponding to an edge portion of the substrate.

14. The method of claim 12, wherein generating the plasma comprises using a conductive faceplate having a concaved portion to reduce local plasma density.

15. The method of claim 12, wherein generating the plasma comprises using a conductive faceplate having a convex portion to increase local plasma density.

16. The method of claim 12, wherein supplying the processing gas comprises flowing a process gas from a plurality of gas distribution holes formed through the conductive faceplate.

* * * * *